United States Patent [19]

Dick

[11] Patent Number: 5,526,279
[45] Date of Patent: Jun. 11, 1996

[54] NESTED OVERLAP REMOVAL FOR PHYSICAL DESIGN DATA USING FRAMES

[75] Inventor: Gregory J. Dick, Beacon, N.Y.

[73] Assignee: International Business Machines Corporation, Armonk, N.Y.

[21] Appl. No.: 310,463

[22] Filed: Sep. 22, 1994

[51] Int. Cl.⁶ .................................................. H01L 23/528
[52] U.S. Cl. ................................................ 364/491; 364/488
[58] Field of Search ................................... 364/488, 489, 364/490, 491, 148; 250/492.2, 492.22

[56] References Cited

U.S. PATENT DOCUMENTS

| | | | |
|---|---|---|---|
| 4,554,625 | 11/1985 | Otten | 364/148 |
| 4,731,643 | 3/1988 | Dunham et al. | 357/68 |
| 4,816,692 | 3/1989 | Rudert, Jr. | 250/492.2 |
| 4,914,304 | 4/1990 | Koyama | 250/492.2 |
| 4,943,729 | 7/1990 | Ando et al. | 250/492.3 |
| 5,073,952 | 12/1991 | Watanabe | 382/8 |
| 5,086,398 | 2/1992 | Moriizumi | 250/492.22 |
| 5,189,306 | 2/1993 | Frei | 250/492.2 |
| 5,193,183 | 3/1993 | Bachman | 385/600 |
| 5,249,300 | 9/1993 | Bachman et al. | 395/800 |
| 5,253,182 | 10/1993 | Suzuki | 364/489 |
| 5,294,800 | 3/1994 | Chung et al. | 250/492.22 |

*Primary Examiner*—Kevin J. Teska
*Assistant Examiner*—Dan Fiul
*Attorney, Agent, or Firm*—Whitham, Curtis, Whitham & McGinn; Richard Lau

[57] ABSTRACT

A technique allows for processing all the original cells of an integrated circuit design without any partial unnesting. In the first step, each nested cell is framed by a bounding box or polygon which contains all the shapes in the cell. In the second step, an overlap removal is performed on the frames. In the third step, for each cell, the shapes within the original frame and any other shapes intruding on the overlap removed frame are retrieved. In the fourth step, overlap removal (or union) is performed on the shapes retrieved in the third step. The overlap removed frame will clip off any pieces outside. Union will integrate any non-original shapes into the cell. After the third and fourth steps have been performed for all cells, the modified cells will contain all the original shape information and are independent.

10 Claims, 11 Drawing Sheets

NESTED OVERLAP REMOVAL FOR PHYSICAL DESIGN DATA USING FRAMES

BACKGROUND OF THE INVENTION

1. Field of the Invention

The present invention generally relates to generating and checking physical design data and, more particularly, a technique of nested image processing of physical design data to remove overlap in the data. The invention has particular application in the manufacture of semiconductor devices.

2. Description of the Prior Art

Integrated circuit (IC) shapes may be patterned on a semiconductor wafer by direct writing electron beam (E-beam) lithography. The intended pattern may be written directly onto the wafer by first exposing a thin layer of radiation sensitive material (resist) on the wafer with a beam of electrons. Alternatively, a thin layer of photoresist on the semiconductor wafer is exposed optically, using a mask made with an E-beam tool. Whether the pattern is directly written with an E-beam or indirectly written with a mask made with an E-beam, the E-beam tool remains the same.

Transferring computer designed patterns of very small geometric shapes that constitute the integrated circuit design to a physical image on a resist or a photoresist can be both expensive and time consuming. Most of the expense associated with transforming the shapes is computer operating cost, which is also generally time dependent. Therefore reducing computer operating time will reduce the expense associated with E-beam lithography.

The complete processing of the physical design data into numerical control (N/C) data can include the functions of Union, Fill (also known as Fracturing), Graysplicing and Proximity Correction.

Union is the process of removing overlap using the edges of the shapes as opposed to using shapes themselves. Overlap left in data sent to an electron beam (E-Beam) lithography tool can cause blooming (growing) of the resultant shapes in the resist. A variable shape electron beam tool, as opposed to a bit-mapped fixed shape electron beam tool, needs the overlap removed in its input data.

The Unioned edges or overlapped removed shapes are then sent to the Fill or Fracturing function. This function converts the input shapes into a set of shapes that the target tool can process. Often, the input shapes consist of rectangles, lines (or paths), polygons, alphanumerics and circles. The set of shapes that the electron beam tools can process is sometimes limited to rectangles and triangles. Some electron beam tools can handle trapezoids and parallelograms. The large set of shapes must be converted to the smaller, more restrictive, set of shapes for output.

A positive Fill involves converting the shapes as input into the set of tool-supported shapes. A negative Fill, or simply Negation, involves converting not the shapes, but the shapes' backgrounds into tool-supported shapes. A design that has a small data volume output in a positive image very likely will have a large data volume in the negative image and, therefore, a large processing time.

Graysplicing is the process of guaranteeing continuity between the subsets of the design that a tool can address at a given time. In some tools, these areas are called Fields and Subfields. Graysplicing involves "stitching" between fields and subfields that are not processed contiguously.

Proximity Correction is the process where each shape's properties are modified based on the influence of neighboring shapes. There are two main proximity correction techniques. One involves changing the shape's exposure time (dose), and the other involves moving the shape's edges. Either method needs information from neighboring shapes over a certain range or radius. Shapes significantly farther away than this range do not need to be figured into the calculations.

If all of these functions are performed unnested (that is, the data hierarchy is flattened), the processing time can be prohibitive.

As stated above, one of the steps involved in the transformation of the geometric shapes which comprise the IC design is overlap removal or Union. Overlap removal is necessary to prevent "blooming" when using E-beam lithography tools. Overlap removal is typically performed on a shape to shape basis. The shapes to be processed are unnested and checked. Alternative procedures are scanline union techniques. Scanline union (of edges) techniques are faster than shape to shape checks, but both techniques are processing time costly. In both of these methods, the pertinent shapes are unnested within a specified area.

U.S. Pat. No. 5,294,800 to Chung et al. describes nested cell processing for E-beam lithography data preparation. These nested cells are either ones that started out completely unintruded in the design data or are combinations of cells where the combination is unintruded. The latter kind of cell is actually partially unnested.

Design Rule Checking (DRC) is another area that involves examining the physical design. DRC includes verifying that one level of shapes of a semiconductor design are properly "covered" by another. Another area involves verifying that there is a complete path or circuit from one point in the design to another. Nested processing can be valuable for DRC also.

To process as much data nested as possible, one needs either to start out with highly nested data or some method to create nested data.

SUMMARY OF THE INVENTION

It is therefore an object of the present invention to provide a technique for processing all the original cells without any partial unnesting.

According to the invention, the process allows for nested processing of the cells. In the first step, each nested cell is framed. That is, a bounding box or polygon is created which contains all the shapes in the cell. In the second step, an overlap removal is performed on the frames. In the third step, for each cell, the shapes within the original frame and any other shapes intruding on the overlap removed frame are retrieved. In the fourth step, overlap removal (or union) is performed on the shapes retrieved in the third step. The overlap removed frame will clip off any pieces outside. Union will integrate any non-original shapes into the cell. After the third and fourth steps have been performed for all cells, the modified cells will contain all the original shape information and are independent. Thus, the cells can be processed nested.

This technique is also applicable to Design Rule Checking. If the object is to verify complete circuits, the framed cells can be used. If there is a complete circuit within each nested cell and a connection at the boundaries, the frames, between the cells, then there is a complete connection overall.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
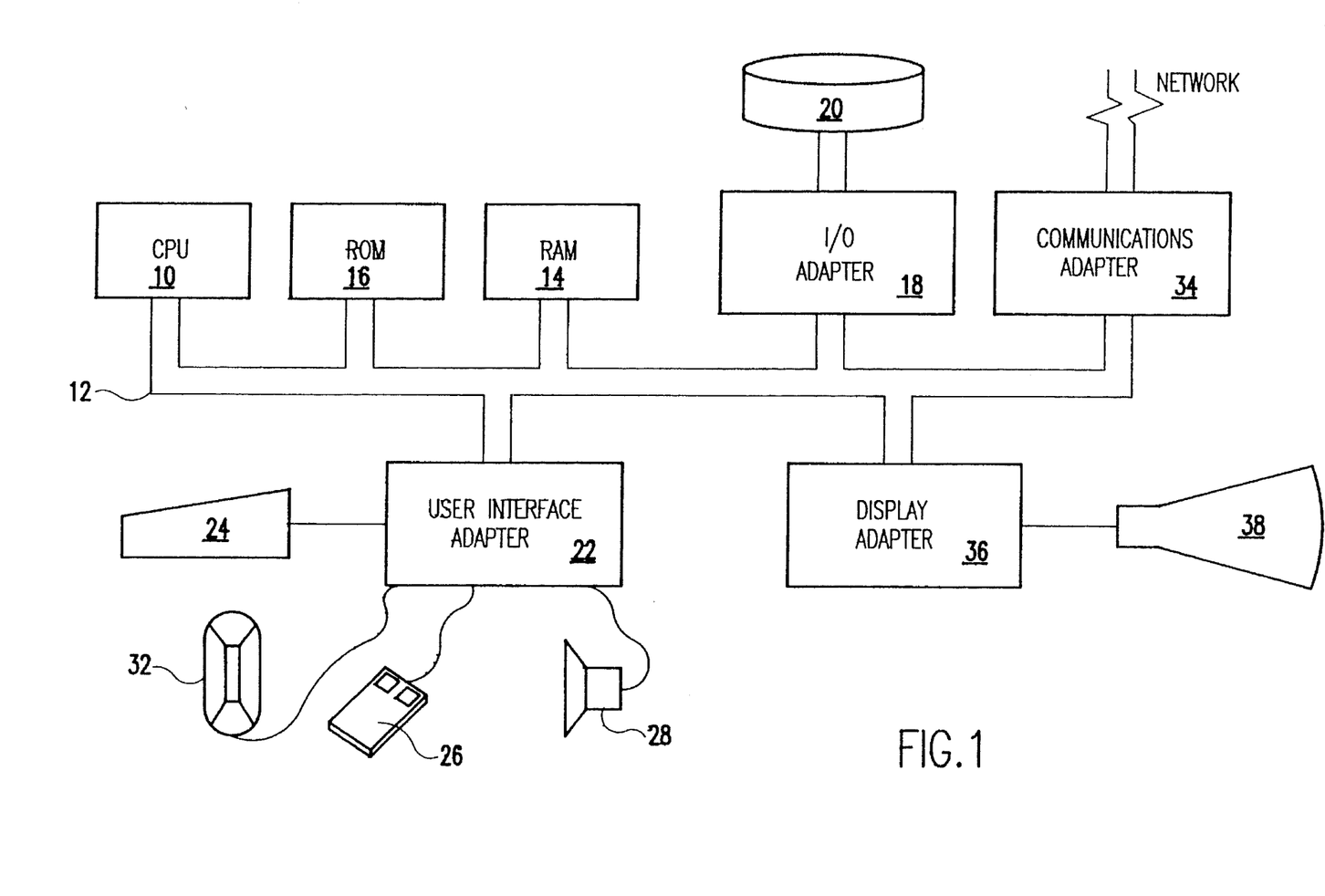
FIG. 1 is a block diagram showing a hardware configuration on which the subject invention may be implemented.

Referring now to the drawings, and more particularly to FIG. 1, there is shown a representative hardware environment on which the subject invention may be implemented. This hardware environment may be a personal computer such as the International Business Machines (IBM) Corporation's RS/6000 Workstation. The hardware includes a central processing unit (CPU) 10, which is typically a reduced instruction set computer (RISC) microprocessor such as IBM's PowerPC microprocessor. The CPU 10 is attached to a system bus 12 to which are attached a read/write or random access memory (RAM) 14, a read only memory (ROM) 16, an input/output (I/O) adapter 18, and a user interface adapter 22. The RAM 14 provides temporary storage for application program code and date, while ROM 16 typically includes the basic input/output system (BIOS) code. The I/O adapter 18 is connected to one or more Direct Access Storage Devices (DASDs), here represented as a disk drive 20. The disk drive 20 typically stores the computer's operating system (OS) and various application programs, each of which are selectively loaded into RAM 14 via the system bus 12. The user interface adapter 22 has attached to it a keyboard 24, a mouse 26, a speaker 28, a microphone 32, and/or other user interface devices (not shown). The workstation also includes a display 38, here represented as a cathode ray tube (CRT) display but which may be a liquid crystal display (LCD). The display 38 is connected to the system bus 12 via a display adapter 34. Optionally, a communications adapter 34 is connected to the bus 12 and to a network, such as a local area network (LAN), such as IBM's Token Ring LAN. Alternatively, the communications adapter may be a modem connecting the personal computer or workstation to a telephone line as part of a wide area network (WAN).

The preferred embodiment of the invention is implemented on the workstation shown in FIG. 1. The process according to the invention will now be described by way of a specific example wherein the physical design data for electronic circuits are transformed into numerical control (N/C) data for an E-Beam lithography tool in the manufacture of semiconductor circuits, and more particularly, the example described is for the process of eliminating overlaps between nested cells.

Figure 2:
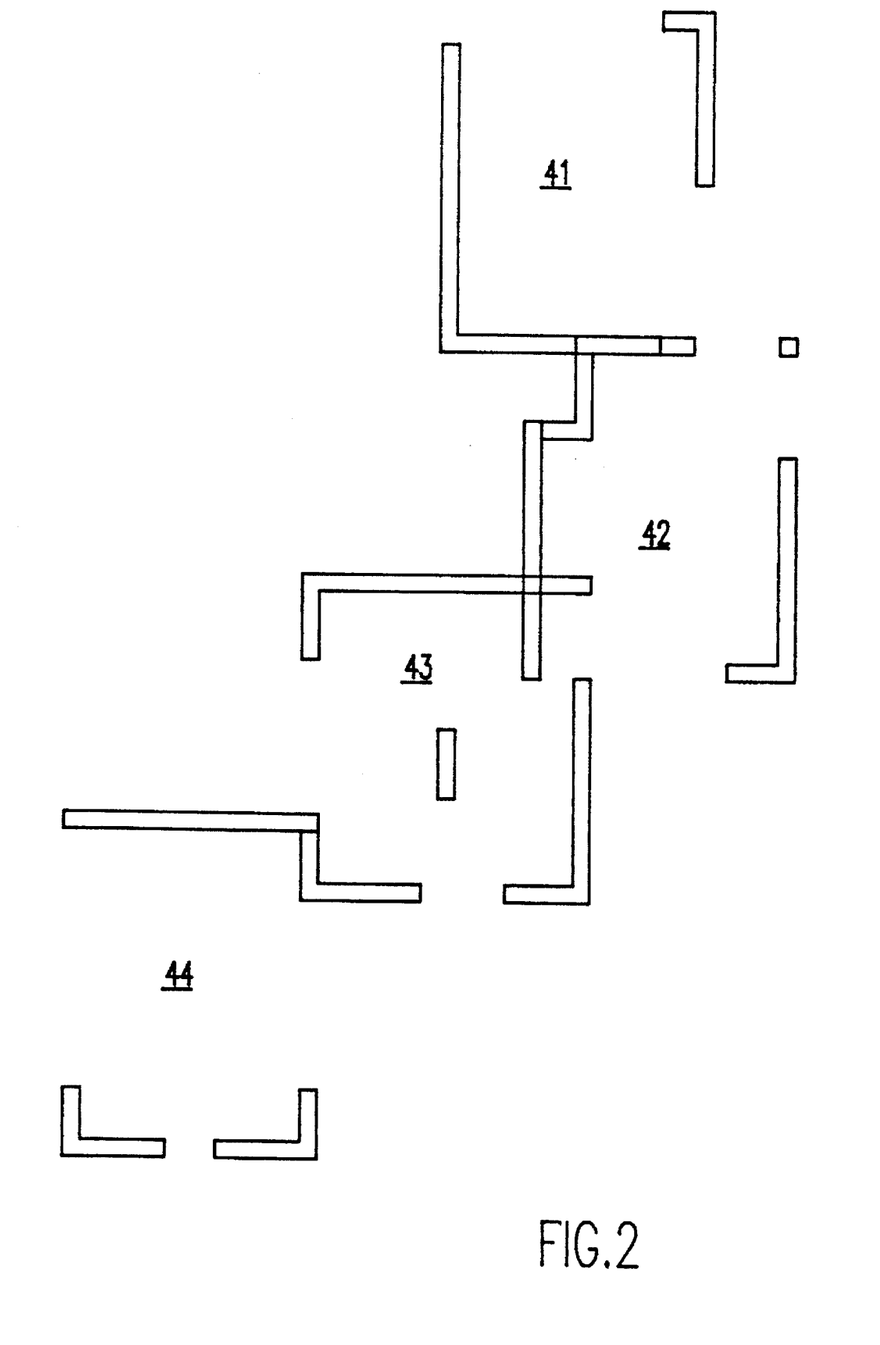
FIG. 2 is plan view showing four cells, each nested into a higher level cell.

With reference first to FIG. 2, there is shown an example of four cells, generally denoted as cells 41, 42, 43, and 44, each nested into a higher level cell. With conventional processing, all four cells would be combined before any processing could be performed. This example of four cells will be used to illustrate how the cells are processed nested according to the invention, and it will be understood that this technique can be used on any arbitrary set of nested cells of geometric shapes which constitute the design of an integrated circuit (IC). The process is shown in FIG. 3, to which reference is now made.

Figure 4:
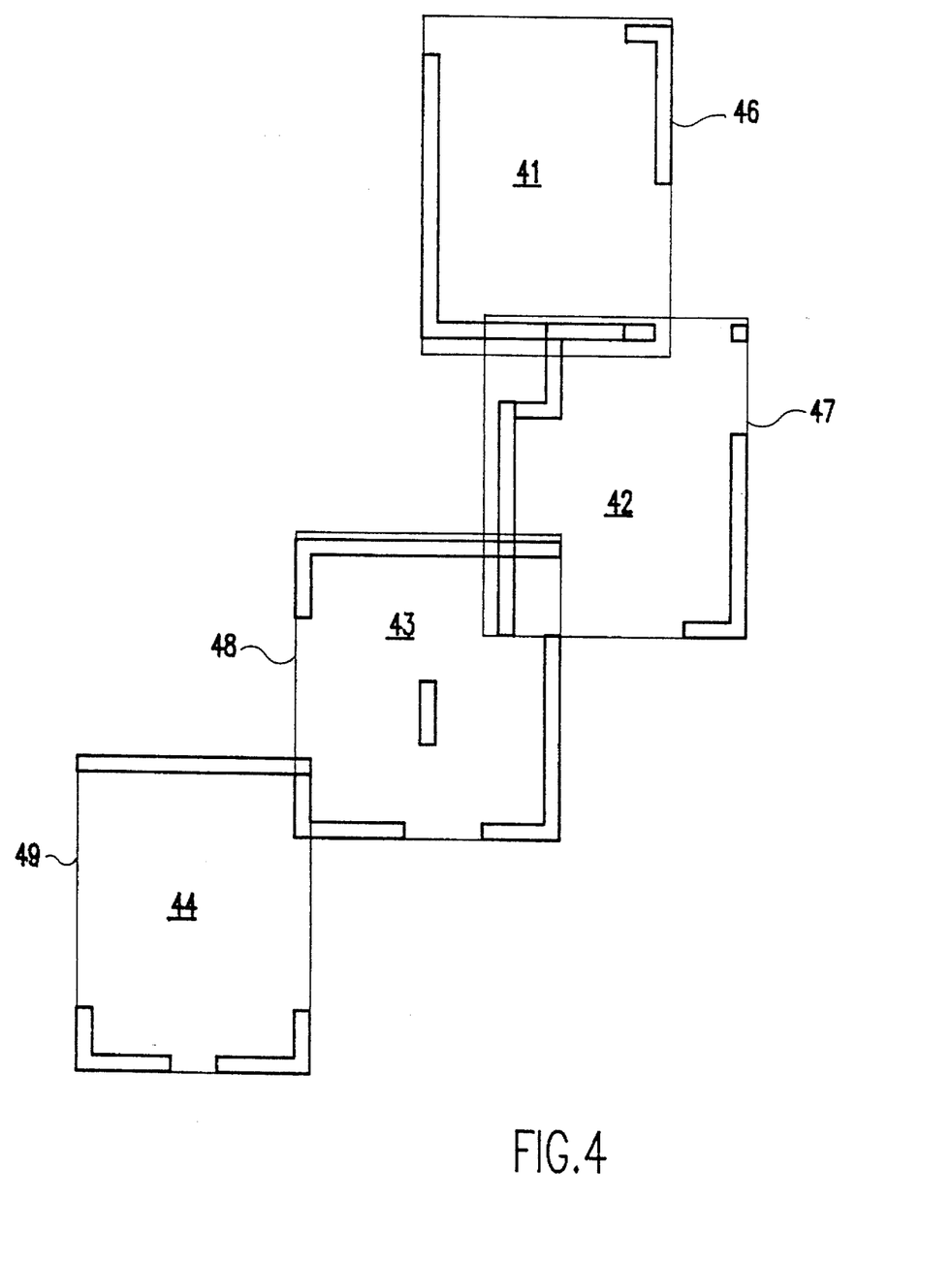
FIG. 4 is a plan view showing the four cells of FIG. 1 framed by a bounding box.

In the first step 45, each nested cell is framed. That is, a bounding box or polygon is created which contains all the shapes in the cell. FIG. 4 is an example using a least enclosing rectangle (LER) as the bounding box. In FIG. 4, cell 41 is bounded by box 46, cell 42 by box 47, cell 43 by box 48, and cell 44 by box 49. A more complex frame may be more efficient depending on the specific circuit design.

Figure 5:
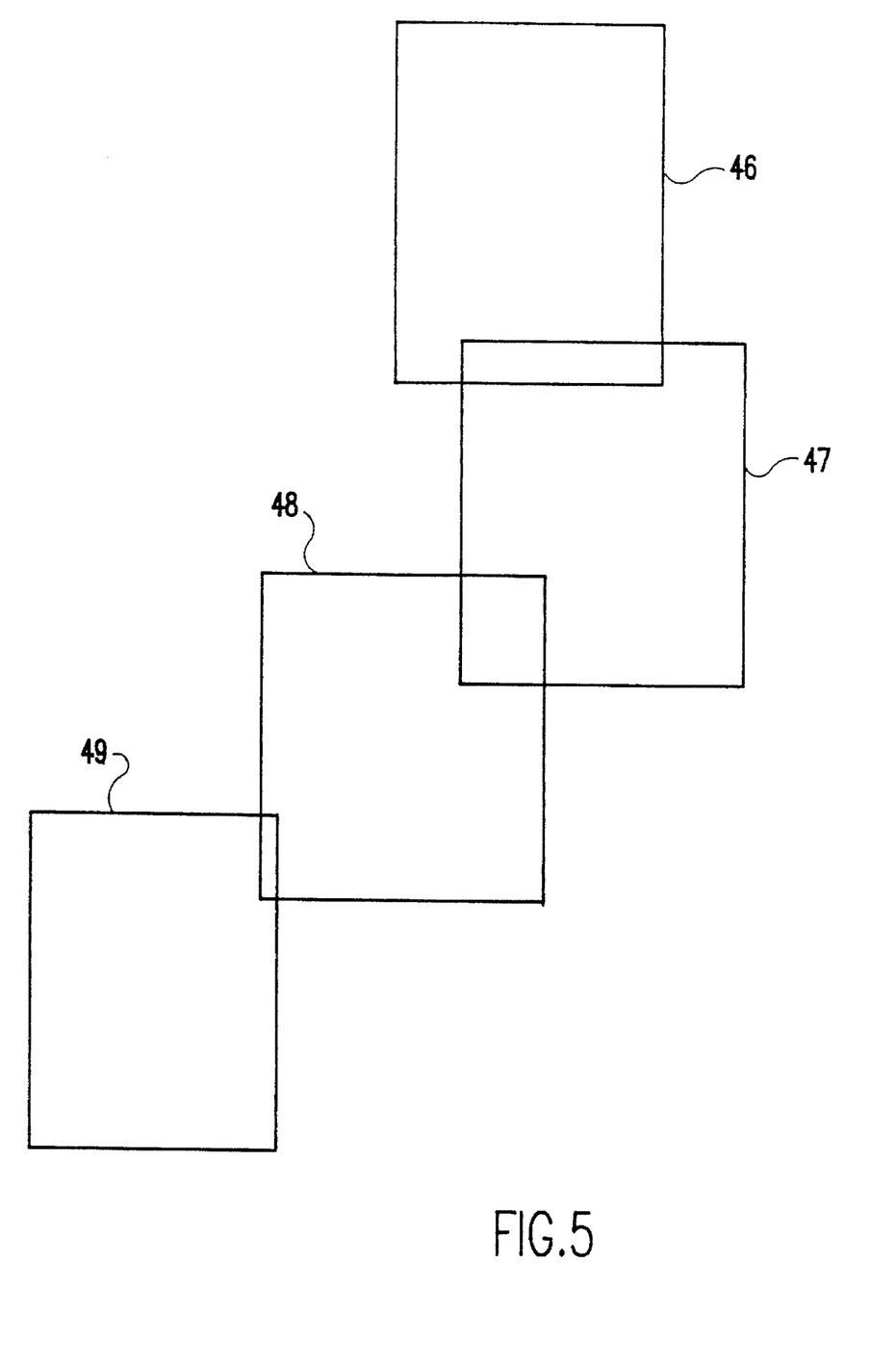
FIG. 5 is a plan view showing the frames of FIG. 3 and their overlaps.
Figure 6:
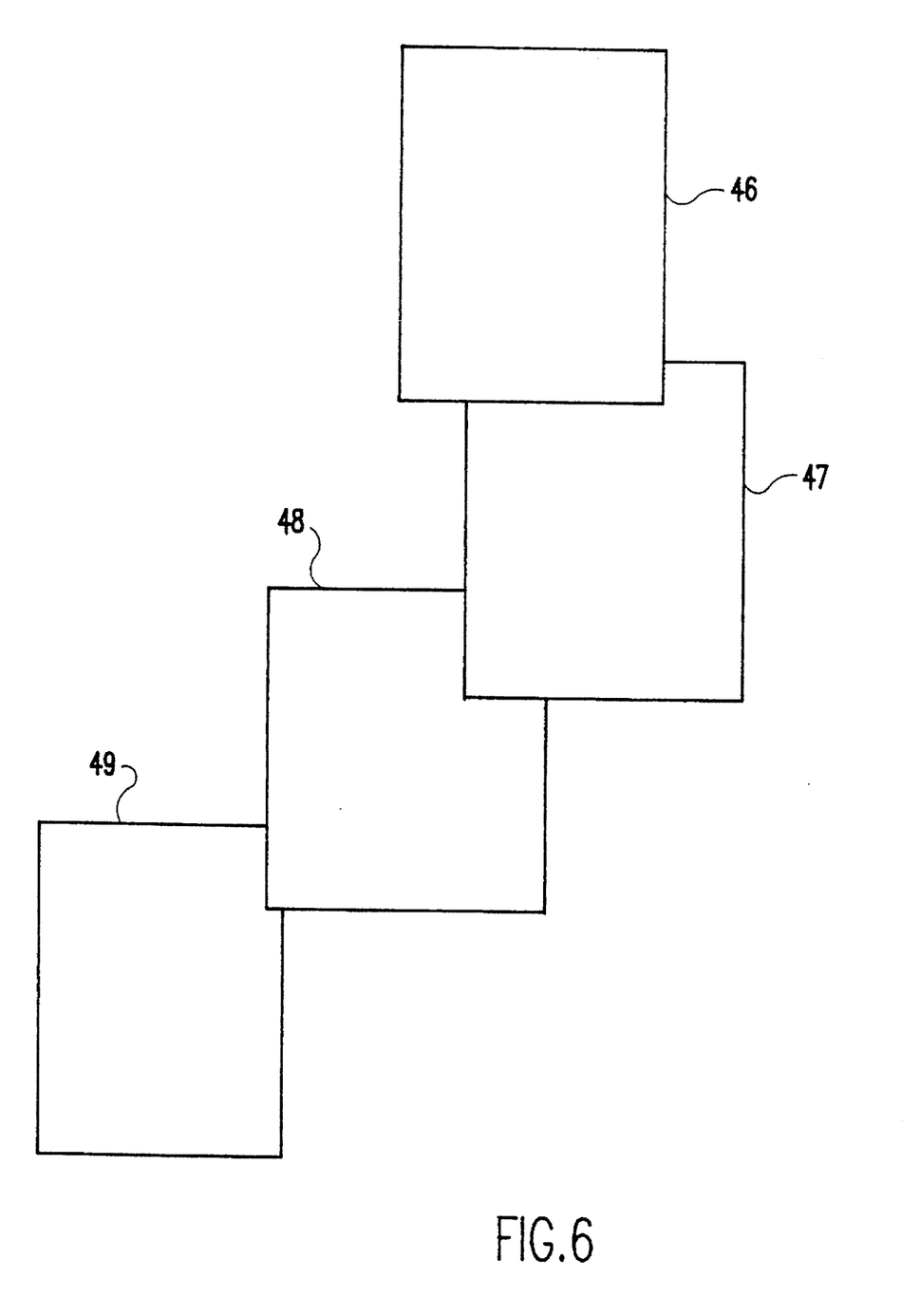
FIG. 6 is a plan view showing the frames of FIG. 4 with their overlaps removed.

In step 50, an overlap removal is performed on the frames, as illustrated in FIGS. 5 and 6. Specifically, in FIG. 5, there is shown only the frames 46, 47, 48, and 49, and it will be observed that each of these frames overlaps one or more adjacent frames. In FIG. 6, the overlaps are removed, showing quite clearly the order of nesting of the cells.

Figure 3:
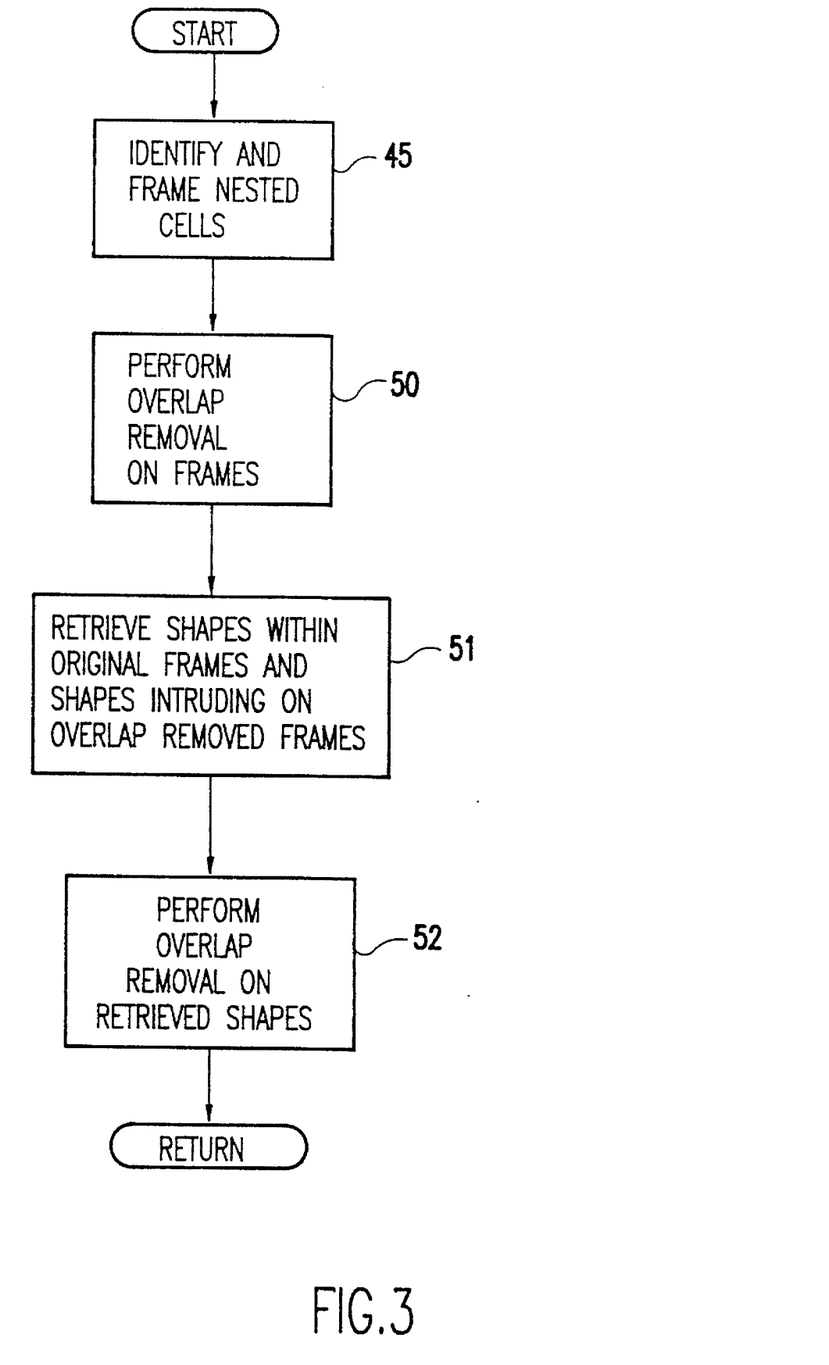
FIG. 3 is a flow diagram showing the process of the invention allowing for nested processing of the four cells shown in FIG. 1.
Figure 7:
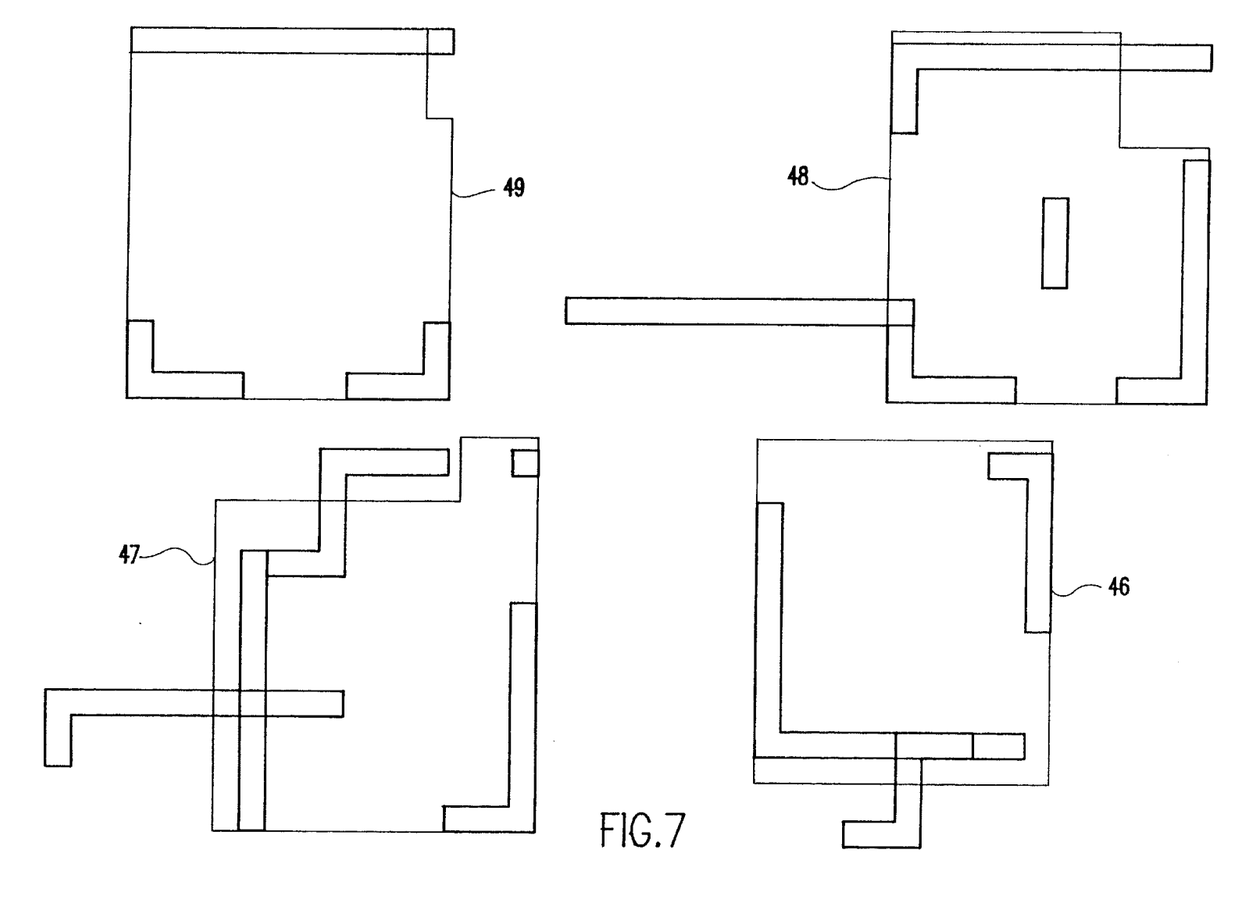
FIG. 7 is a plan view showing the overlap removed frames with pieces of intruding shapes to be clipped.

In step 51 in FIG. 3, for each cell, the shapes within the original frame and any other shapes intruding on the overlap removed frame are retrieved. The four sets of shapes for the example are shown in FIG. 7.

Figure 8:
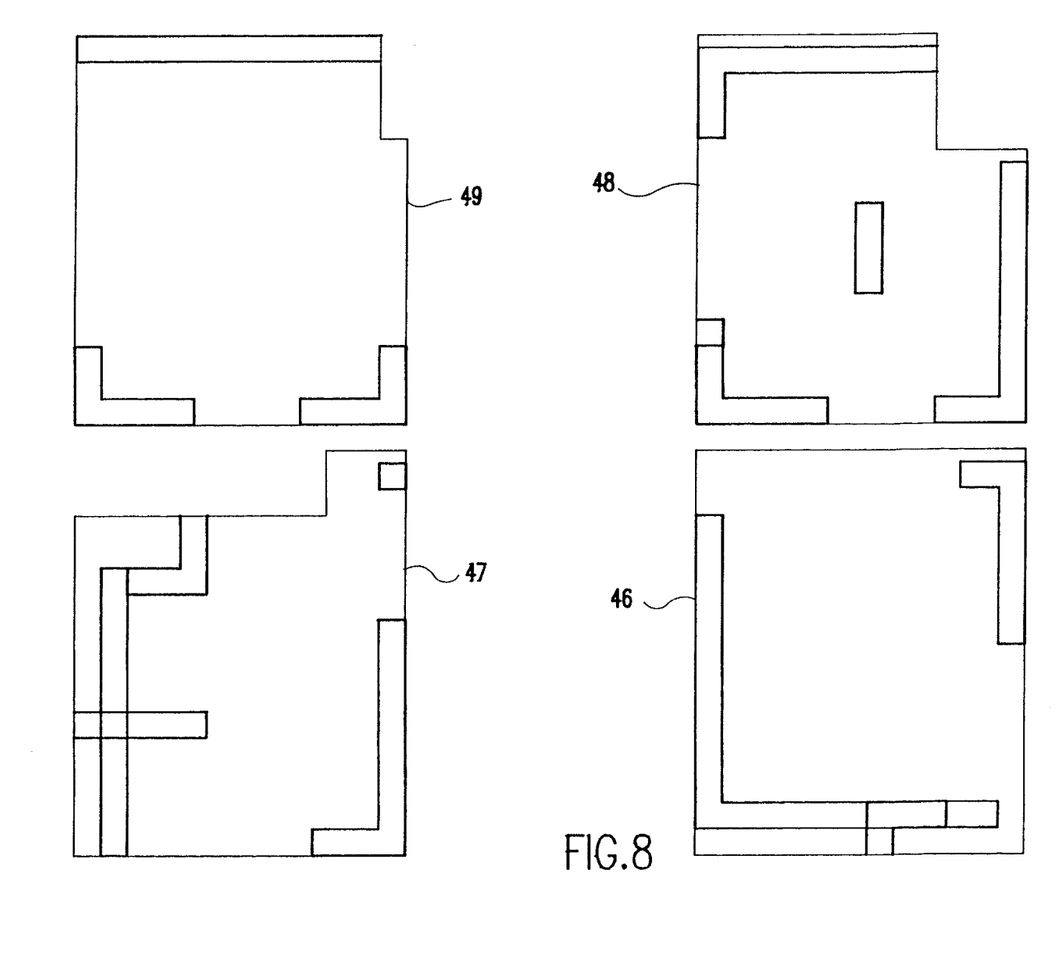
FIG. 8 is a plan view showing a union of the overlap removed frames and the original shape information.

In step 52 in FIG. 3, overlap removal (or Union) is performed on the shapes retrieved in step 51. The overlap removed frame will clip off any pieces outside. Union will integrate any non-original shapes into the cell. The result is shown in FIG. 8.

Figure 9:
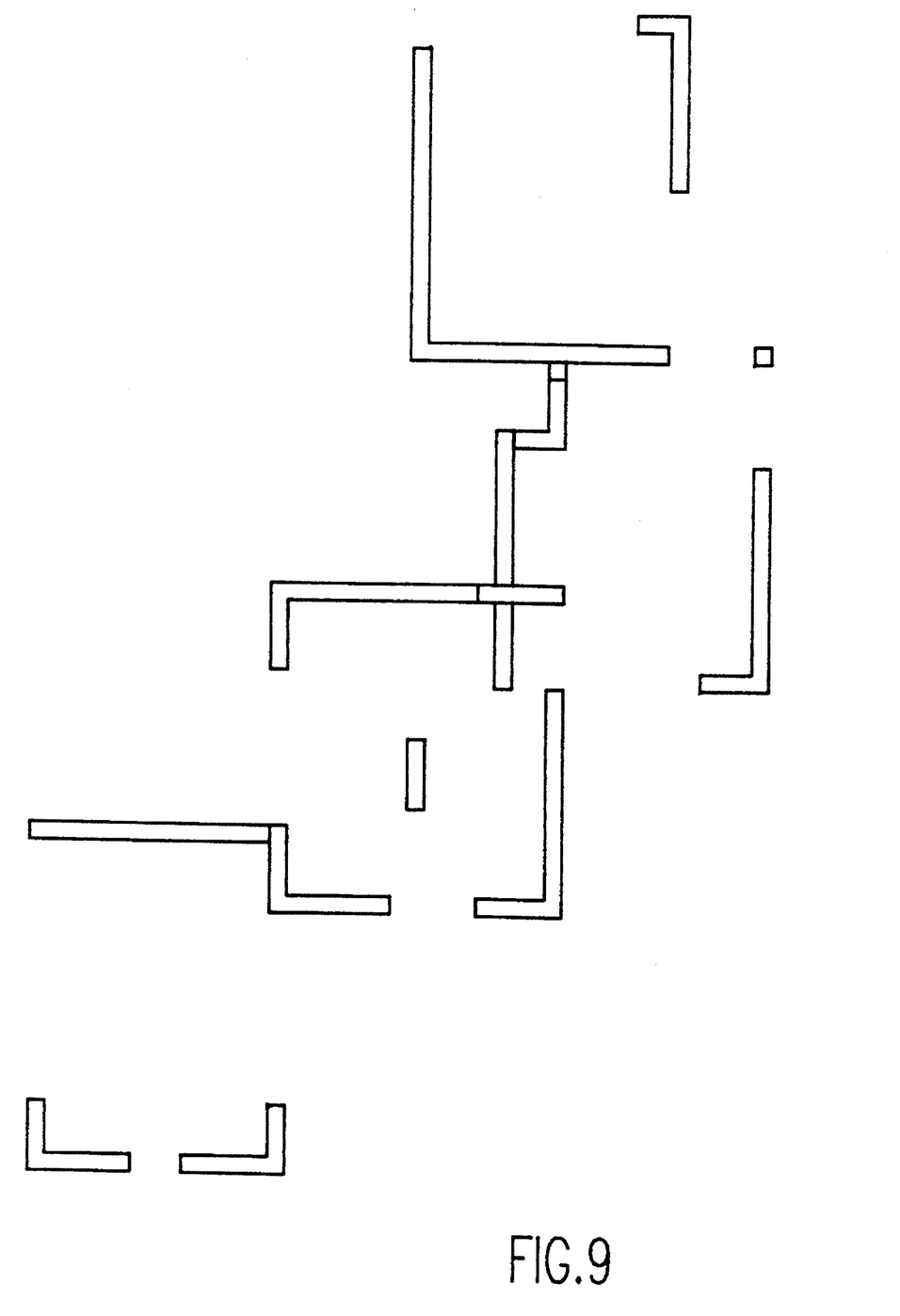
FIG. 9 is a plan view showing the resultant shapes in place after overlaps have been removed.

After steps 51 and 52 have been performed for all cells, the modified cells will contain all the original shape information and are independent. FIG. 9 shows the result of this processing. More particularly, FIG. 9 shows the resultant shapes in place after the overlaps have been removed. Thus, the cells can be processed nested and in parallel.

The process described considers only the processing of physical design data to remove overlap, that is Union. As mentioned, the complete processing of the physical design data into numerical control (N/C) data can include in addition to Union, the functions of Fill (also known as Fracturing), Graysplicing and Proximity Correction. It will therefore be understood that the cells can be processed nested through Union, Union and Fill, or Union, Fill and Graysplicing.

Figure 10:
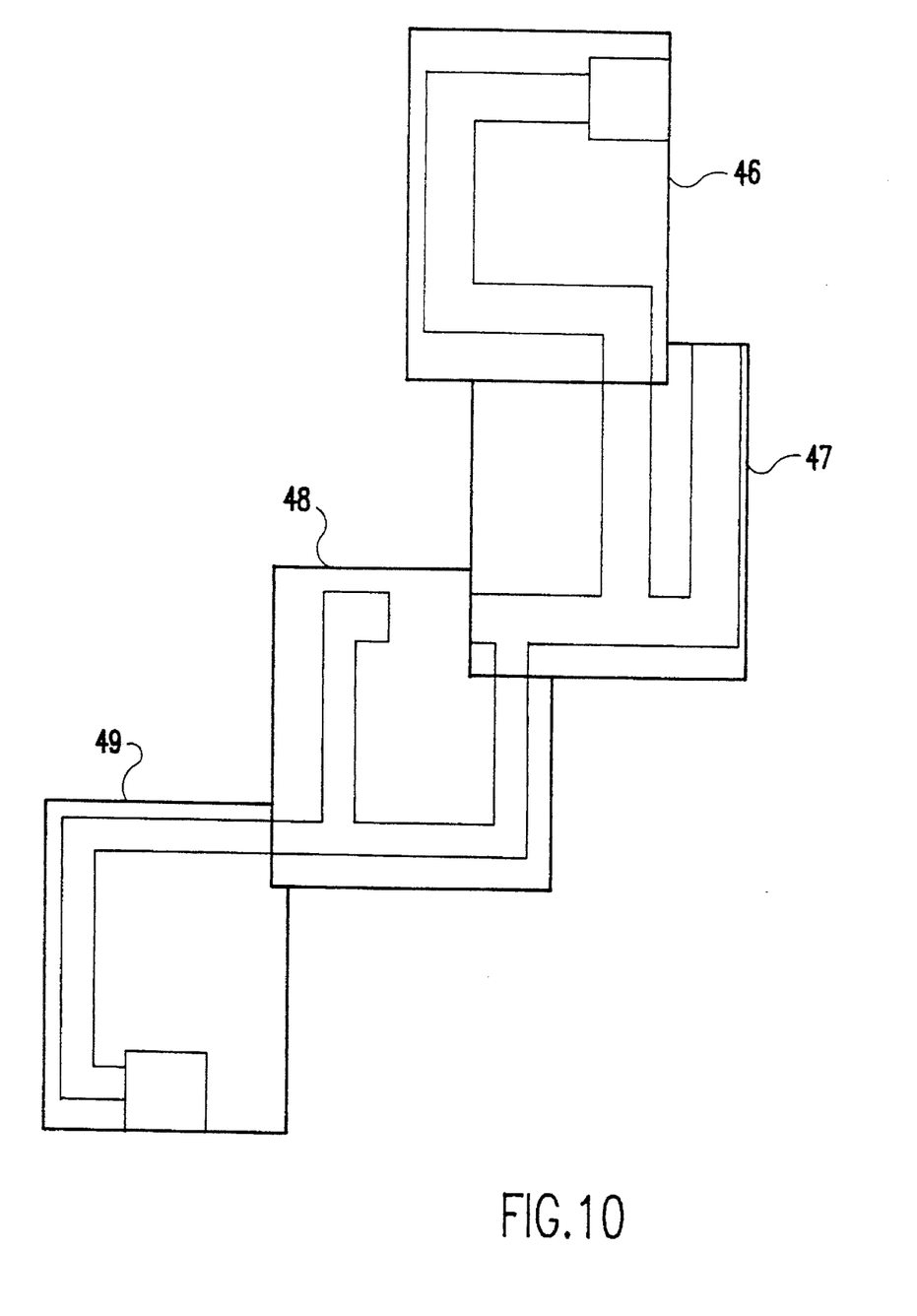
FIG. 10 is a plan view showing a set of shapes to illustrate the application of the invention to Design Rule Checking.
Figure 11:
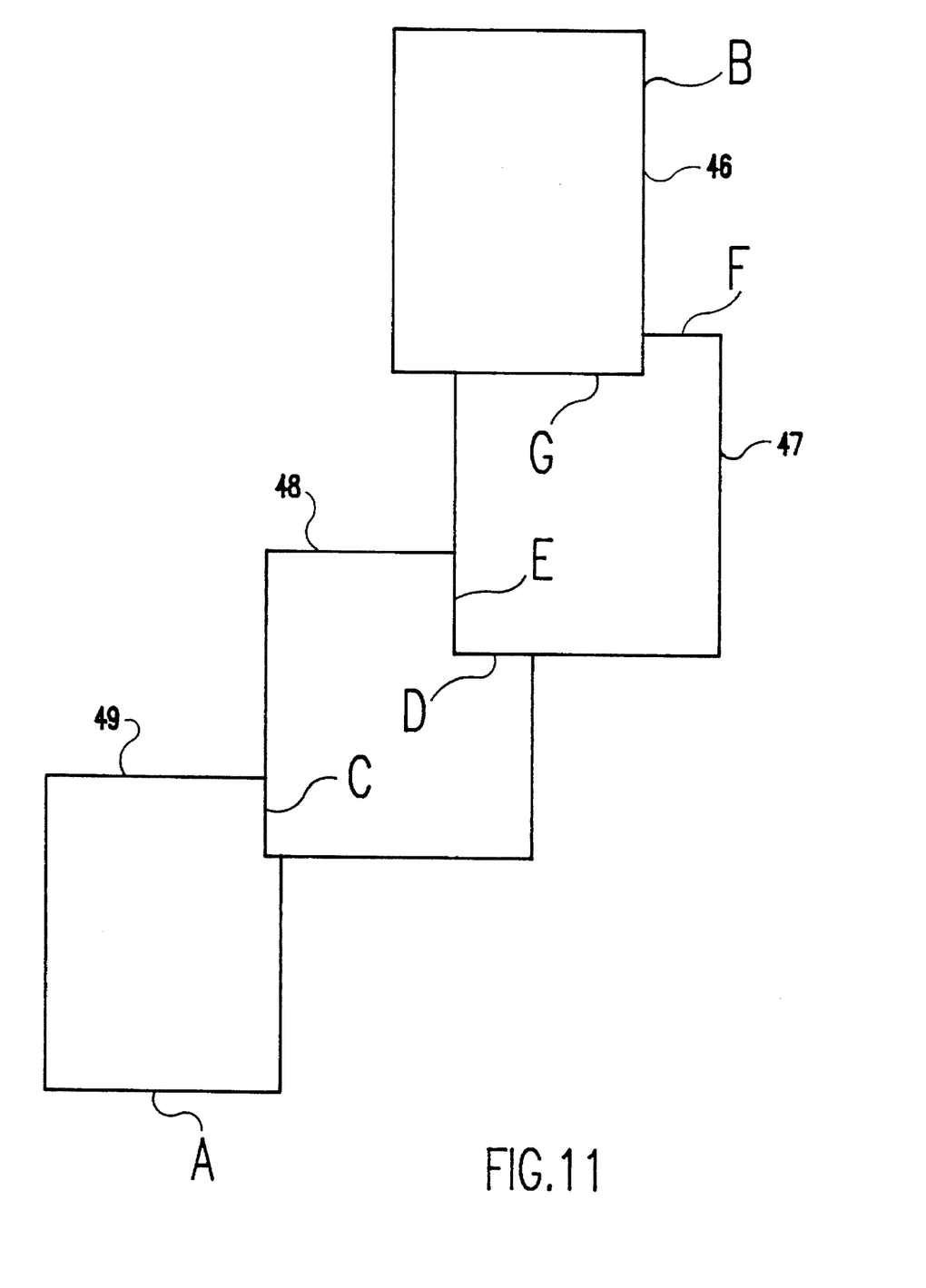
FIG. 11 is a plan view showing a set of frames for the set of shapes shown in FIG. 10.

The invention also has application to Design Rule Checking (DRC). FIG. 10 shows a set of shapes for which the same set of overlap frames will be produced as in FIG. 6. After the overlap removed frames are determined, each cell's list of shape intersections with the frame are found. This can be done once, in nested fashion for each cell. In this example, these are designated by locations A, B, C, D, E, F, and G in FIG. 11. If we wish to know whether there is a complete circuit (path) from location A to location B, we can examine the connections between the noted locations in the cells. Thus, through the progression of A→C, C→D, D→G, G→B, we can see that there is indeed a circuit from A to B.

In similar fashion, cell coverage between one layer of the IC to another can be performed using the overlap removed frames. Specifically, if the frame representing a cell does not cover the frame representing the cell it is supposed to cover, then the shapes within these cells cannot have the correct relationship.

While the invention has been described in terms of a single preferred embodiment with two specific applications, those skilled in the art will recognize that the invention can be practiced with modification within the spirit and scope of the appended claims. More particularly, those skilled in the art will recognize that the novelty of the invention resides in facilitating nested processing in a process that makes the cells independent. Since the process makes the cells independent, they can be processed in a nested fashion and in parallel. Thus, while the preferred embodiment was written for physical design translation to numerical control data, the invention can be applied to other areas, including Design Rule Checking (DRC).

Having thus described my invention, what I claim as new and desire to secure by Letters Patent is as follows:

1. A method of nested processing of physical design data of electronic circuits to convert the physical design data to numerical control data for use by a tool, said method using frames to perform overlap removal and comprising the steps of:

framing nested cells;

removing overlaps on the frames only;

retrieving the shapes within the original frame and any other shapes intruding on the overlap removed frame for the current cell;

performing overlap removal on the shapes retrieved; and independently processing the nested cells nested to obtain the numerical control data.

2. The method recited in claim 1, wherein the step of performing overlap removal is done by a Union operation of the frames and the retrieved shapes for each frame.

3. The method recited in claim 1, wherein each of said cells are independent and the processing of the cells is performed in parallel.

4. The method recited in claim 3, wherein the step of performing overlap removal is done by a Union operation of the frames and the retrieved shapes for each frame.

5. The method recited in claim 4, further comprising the step of converting input shapes into a set of tool-supported shapes by a Fill operation.

6. The method recited in claim 5, further comprising the step of Graysplicing subsets of the design which can be supported by the tool at a given time, thereby guaranteeing continuity between the subsets of the design.

7. The method recited in claim 4, further comprising the step of converting backgrounds of input shapes into a set of tool-supported shapes by a Negative Fill operation.

8. The method recited in claim 7, further comprising the step of Graysplicing subsets of the design which can be supported by the tool at a given time, thereby guaranteeing continuity between the subsets of the design.

9. The method recited in claim 1, further comprising the step of Proximity Correction whereby each shape's properties are modified based on the influence of neighboring shapes, shapes within cells that are significantly far away from the frames being Proximity Corrected nested.

10. A method of design rule checking of physical design data of electronic circuits to determine circuit continuity, said method using frames to locate connections between nested cells and comprising the steps of:

framing nested cells;

removing overlaps on the frames only;

locating shape intersections with overlap removed frames;

generating a list of the shape intersections; and checking circuit continuity by determining circuit connections within each of the nested cells between shape intersections.

* * * * *